(12) United States Patent
Liu

(10) Patent No.: US 11,758,756 B2
(45) Date of Patent: Sep. 12, 2023

(54) PACKAGING STRUCTURE, DISPLAY PANEL AND DISPLAY DEVICE INCLUDING MICROSTRUCTURE LAYER

(71) Applicant: BOE TECHNOLOGY GROUP CO., LTD., Beijing (CN)

(72) Inventor: Ming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 17/228,791

(22) Filed: Apr. 13, 2021

(65) Prior Publication Data

US 2022/0102677 A1    Mar. 31, 2022

(30) Foreign Application Priority Data

Sep. 27, 2020  (CN) .......................... 202011035741.5

(51) Int. Cl.
 *H01L 51/52*  (2006.01)

(52) U.S. Cl.
 CPC .... *H01L 51/5253* (2013.01); *H01L 2251/301* (2013.01)

(58) Field of Classification Search
 CPC ......... H01L 2251/301; H01L 2251/558; G02F 2001/133357
 See application file for complete search history.

(56) References Cited

U.S. PATENT DOCUMENTS

| | | | | |
|---|---|---|---|---|
| 8,946,747 B2 * | 2/2015 | Reiherzer | ............... | H01L 33/54 257/94 |
| 10,074,826 B2 * | 9/2018 | Park | .................... | H01L 27/3211 |
| 10,079,362 B2 * | 9/2018 | Kim | ......................... | H01L 51/56 |
| 10,128,462 B2 * | 11/2018 | Son | ..................... | H01L 51/5253 |
| 10,153,461 B1 | 12/2018 | Liu | | |
| 10,181,578 B2 * | 1/2019 | Li | ......................... | H01L 51/004 |
| 10,243,174 B2 * | 3/2019 | Li | ......................... | H01L 51/529 |

(Continued)

FOREIGN PATENT DOCUMENTS

| | | | | |
|---|---|---|---|---|
| CN | 106328826 A | * | 1/2017 | ......... H01L 51/5253 |
| CN | 107611279 A | | 1/2018 | |

(Continued)

OTHER PUBLICATIONS

China National Intellectual Property Administration, First office action of Chinese application No. 202011035741.5 dated Mar. 4, 2023, which is foreign counterpart application of this US application.

*Primary Examiner* — Ida M Soward

(74) *Attorney, Agent, or Firm* — Lippes Mathias LLP

(57) ABSTRACT

Provided is a packaging structure, including an inorganic packaging layer and an organic packaging layer that are laminated on a substrate, wherein the organic packaging layer includes a microstructure layer and a planarization layer, a refractive index of the planarization layer being lower than that of the microstructure layer; wherein the microstructure layer includes a base structure on the inorganic packaging layer and a plurality of protrusion structures spaced apart on a surface of the base structure away from the inorganic packaging layer; and the planarization layer fills at least gaps between adjacent protrusion structures, and a side of the planarization layer away from the inorganic packaging layer is of a planar structure.

20 Claims, 5 Drawing Sheets

(56) References Cited

U.S. PATENT DOCUMENTS

| | | | | |
|---|---|---|---|---|
| 11,114,641 | B2 * | 9/2021 | Xu | H01L 51/0097 |
| 2005/0276211 | A1 * | 12/2005 | Hirotsune | G11B 7/24038 |
| 2006/0110914 | A1 * | 5/2006 | Gehoski | B82Y 10/00 |
| | | | | 257/E21.582 |
| 2012/0256202 | A1 * | 10/2012 | Lee | H01L 33/54 |
| | | | | 257/E33.059 |
| 2017/0104183 | A1 | 4/2017 | Li et al. | |
| 2017/0117504 | A1 * | 4/2017 | Kim | H01L 51/5256 |
| 2017/0271623 | A1 * | 9/2017 | Wang | H01L 51/5268 |
| 2018/0212186 | A1 * | 7/2018 | Jin | H01L 51/5262 |
| 2019/0326551 | A1 * | 10/2019 | Huang | H01L 51/56 |
| 2021/0234129 | A1 * | 7/2021 | Zhang | H01L 51/52 |

FOREIGN PATENT DOCUMENTS

| | | | | | |
|---|---|---|---|---|---|
| CN | 109192878 | A | * | 1/2019 | H01L 27/3251 |
| CN | 109494309 | A | | 3/2019 | |
| CN | 109817823 | A | | 5/2019 | |
| CN | 109817830 | A | * | 5/2019 | H01L 51/5253 |
| CN | 109841644 | A | | 6/2019 | |

* cited by examiner

First direction

United States Patent US 11,758,756 B2

PACKAGING STRUCTURE, DISPLAY PANEL AND DISPLAY DEVICE INCLUDING MICROSTRUCTURE LAYER

CROSS REFERENCE TO RELATED APPLICATIONS

This application claims priority to Chinese Patent Application No. 202011035741.5, filed on Sep. 27, 2020 and entitled "PACKAGING STRUCTURE, DISPLAY PANEL AND DISPLAY DEVICE," the entire content of which is incorporated herein by reference.

TECHNICAL FIELD

The present disclosure relates to the field of display technologies, and in particular to a packaging structure, a display panel and a display device.

BACKGROUND

With the rapid development of mobile internet technologies, organic light emitting diode (OLED) display panels are increasingly favored in the market.

SUMMARY

The present disclosure provides a packaging structure, a display panel and a display device.

In a first aspect of embodiments of the present disclosure, a packaging structure is provided. The packaging structure includes an inorganic packaging layer and an organic packaging layer that are laminated on a substrate, wherein the organic packaging layer includes a microstructure layer and a planarization layer that are sequentially laminated in a direction away from the substrate, a refractive index of the planarization layer being lower than that of the microstructure layer; the microstructure layer includes a base structure disposed on the inorganic packaging layer and a plurality of protrusion structures extending from a surface of the base structure away from the inorganic packaging layer, and the plurality of protrusion structures is spaced apart on the surface of the base structure away from the inorganic packaging layer; and the planarization layer at least fill gaps between adjacent protrusion structures, and a side of the planarization layer away from the inorganic packaging layer is of a planar structure.

Optionally, a section of the protrusion structure in a first direction is rectangular, and the first direction is a direction in which the plurality of protrusion structures is spaced apart.

Optionally, a ratio of a height of the protrusion structure in a direction perpendicular to the base structure to a distance between the adjacent protrusion structures ranges from 1 to 5.

Optionally, the protrusion structure has at least one of the following technical features:
distances between the adjacent protrusion structures are equal;
the protrusion structures have an equal height in the direction perpendicular to the base structure; or
the protrusion structures have an equal width in the first direction.

Optionally, the protrusion structure has at least one of the following technical features: the distance between the adjacent protrusion structures is 1 nm to 200 nm; the height of the protrusion structure in the direction perpendicular to the base structure is 1 nm to 500 nm; and the width of the protrusion structure in the first direction is 1 nm to 200 nm.

Optionally, a section of the protrusion structure in a first direction is triangular, and the first direction is a direction in which the plurality of protrusion structures is spaced apart.

Optionally, a maximum width of the protrusion structure in the first direction is 200 nm to 1000 nm; and/or the height of the protrusion structure in a direction perpendicular to the base structure is 200 nm to 800 nm.

Optionally, a minimum distance between the adjacent protrusion structures is 0 to 200 nm.

Optionally, the microstructure layer is made from a transparent organic material with a refractive index higher than 1.5; and/or the planarization layer is made from a transparent organic material with a refractive index of 1 to 1.5.

Optionally, the microstructure layer is made from acrylic acid-acrylic resin; and the planarization layer is made from an optical adhesive.

In a second aspect of the embodiments of the present disclosure, a display panel is provided. The display panel includes a substrate and the packaging structure as defined in the first aspect.

Optionally, the substrate includes a base layer, as well as a switching device layer and a light-emitting device layer sequentially laminated on the base layer, wherein the inorganic packaging layer of the packaging structure is disposed on a side of the light-emitting device layer away from the base layer.

In a third aspect of the embodiments of the present disclosure, a display device is provided. The display device includes a power supply component and the display panel as defined in the second aspect, wherein the power supply component is configured to supply power for the display panel.

Figure 1:
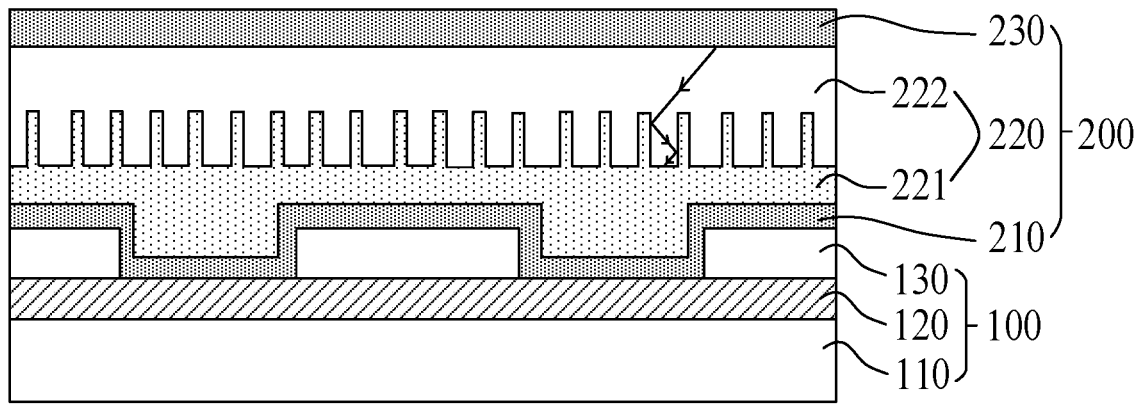
FIG. 1 is a schematic structural diagram of a packaging structure and a substrate that are laminated up according to an embodiment of the present disclosure.

In the drawings, the reference numerals represent the following components:
10—display panel; 20—power supply component;

100—substrate; 110—base layer; 120—switching device layer; 130—light-emitting device layer;
200—packaging structure;
210—first inorganic packaging layer;
220—organic packaging layer; 221—microstructure layer; 221a—base structure;
221b—protrusion structure;
222—planarization layer; and
230—second inorganic packaging layer.

DETAILED DESCRIPTION

The present disclosure is described in detail hereinafter. Examples of the embodiments of the present disclosure are illustrated in the accompanying drawings. The same or similar reference numerals throughout indicate the same or similar elements or elements with the same or similar functions. In addition, a detailed description of the known technology unnecessary for the illustrated features of the present disclosure can be omitted. The embodiments described below with reference to the accompanying drawings are examples which are intended for illustration only, and are not to be construed as limitations to the present disclosure.

Those skilled in the art will appreciate that all terms (including technical and scientific terms) used herein have the same meanings as commonly understood by those of ordinary skill in the art of the present disclosure, unless otherwise defined. It should also be understood that terms such as those defined in the general dictionary should be understood to have the meanings consistent with the meanings in the context of the prior art, and will not be interpreted in an idealized or overly formal meaning unless specifically defined herein.

It's to be understood by those skilled in the art that the singular forms "a", "an", "the" and "said" may also encompass plural forms, unless otherwise stated. It should be further understood that the expression "comprise" used in the description of the present disclosure means there exists a feature, an integer, a step, an operation, an element and/or a component, but could not preclude the existence or addition of one or more other features, integers, steps, operations, elements, components and/or groups thereof. The expression "and/or" used herein includes all or any one, or all combinations of one or more listed items that are relevant.

An OLED display panel has the problem of high reflectivity on the surface of the screen, which adversely affects the normal display brightness. In order to meet the normal display requirements, it is often necessary to additionally improve the screen brightness, which increases the entire power consumption of the display panel.

An embodiment of the present disclosure provides a packaging structure, capable of improving the brightness of the screen without increasing the power consumption of the display panel. The technical solutions of the present disclosure and how the technical solutions of the present disclosure solve the above technical problem are described in detail below with specific embodiments.

Figure 2:
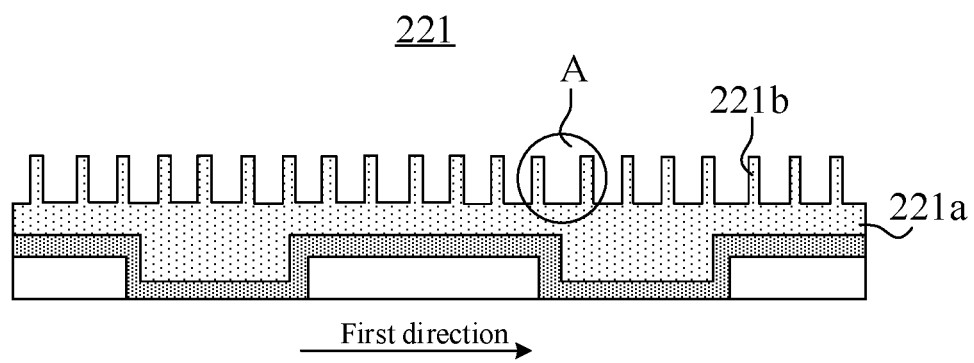
FIG. 2 is a schematic structural diagram of a microstructure layer of a packaging structure according to an embodiment of the present disclosure.

As shown in FIG. 1 and FIG. 2, an embodiment of the present disclosure provides a packaging structure 200, including an inorganic packaging layer and an organic packaging layer 220 laminated on a substrate 100. It can be understood that the packaging structure 200 generally includes a plurality of inorganic packaging layers and a plurality of organic packaging layer 220, which are alternately laminated, and the specific number of layers of the inorganic packaging layers and the organic packaging layers 220 may be set based on actual demands of the packaging structure 200. In this embodiment, a "sandwich" structure consisting of one inorganic packaging layer (illustrated as the first inorganic packaging layer 210 in FIG. 1), one organic packaging layer 220 and another inorganic packaging layer (illustrated as the second inorganic packaging layer 230 in FIG. 1) is illustrated. Unless otherwise specified, the inorganic packaging layer in all embodiments of the present disclosure refers to the first inorganic packaging layer 210.

In order to reduce the reflection effect of the packaging structure 200 on externally incident light, the organic packaging layer 220 may be designed as a structure including two film layers with different refractive indexes, namely a microstructure layer 221 and a planarization layer 222. Referring to FIG. 1, the microstructure layer 221 and the planarization layer 222 are sequentially laminated in a direction away from the substrate 100, that is, the microstructure layer 221 is close to the substrate 100 and the planarization layer 222 is away from the substrate 100. In addition, the refractive index of the planarization layer 222 is lower than that of the microstructure layer 221. Thus, light incident into the organic packaging layer 220 from the outside first enters a medium with a lower refractive index (an optically thinner medium) and then enters a medium with a higher refractive index (an optically denser medium), to avoid total reflection, such that light can be incident into the packaging structure 200 as much as possible.

As shown in FIG. 2, the microstructure layer 221 includes a base structure 221a on the inorganic packaging layer and a plurality of protrusion structures 221b. The base structure 221a is parallel to the substrate 100, and the plurality of protrusion structures 221b is formed by extension of the surface of the base structure 221a to the side away from the inorganic packaging layer. The plurality of protrusion structures 221b is spaced apart on the surface of the base structure 221a away from the inorganic packaging layer, so that light incident from the planarization layer 222 may be incident into the microstructure layer 221 from an area between the adjacent protrusion structures 221b. The arrows in FIG. 1 show an optical path along which the externally incident light is incident from the planarization layer 222 into the area between the protrusion structures 221b, that is, the externally incident light is blocked in the area between the adjacent protrusion structures 221b and finally incident into the base structure 221a, which further improves the transmittance of the externally incident light.

In order to maintain the original packaging structure 200, the protrusion structures 221b of the microstructure layer 221 are planarized by the planarization layer 222. Referring to FIG. 1, at least gaps between the adjacent protrusion structures 221b are filled with and leveled up by the planarization layer 222, and the side of the planarization layer 222 away from the inorganic packaging layer is of a planar structure. The side of the planarization layer 222 away from the inorganic packaging layer may be flush with the side of the protrusion structure 221b away from the inorganic packaging layer, or may completely cover all the protrusion structures 221b.

Optionally, the base structure 221a and the protrusion structures 221b may be integrally formed, or prepared by film forming and patterning processes.

It can be understood that the substrate 100 in the present embodiment may be a display function structure including a base layer 110, a switching device layer 120, and a light-emitting device layer 130. Certainly, the substrate 100 may also be other functional structures based on different structures of terminal products. As the substrate 100 does not affect the specific structure or function of the packaging structure 200, the substrate 100 may not be limited in the present embodiment.

In addition, the protrusion structures 221b in the present embodiment may be arranged independently (similar to bosses), or spaced apart in a strip-shaped fashion. In various embodiment of the present disclosure, the strip-shaped protrusion structures 221b are taken as examples for description, and the length extension direction of the protrusion structures 221b may be parallel to the base structure 221a and the substrate 100.

In the packaging structure 200 provided by the present embodiment, the organic packaging layer 220 includes the microstructure layer 221 and the planarization layer 222 having different refractive indexes, such that light incident into the organic packaging layer 220 from outside enters a medium of the microstructure layer 221 with a relatively high refractive index from a medium of the planarization layer 222 with a relatively low refractive index, thereby avoiding total reflection and reducing the reflectivity of the externally incident light.

The plurality of protrusion structures 221b in the microstructure layer 221 are spaced apart on the surface of the base structure 221a away from the inorganic packaging layer, so that light incident from the planarization layer 222 may be incident into the microstructure layer 221 from the area between the adjacent protrusion structures 221b, and the incident light may be blocked in the microstructure layer 221. Therefore, the transmittance of the externally incident light may be further improved to increase the display brightness without increasing the power consumption of the display panel. The microstructure layer 221 has the effect of reducing the reflectivity and thus may replace a polaroid, such that the preparation process is simplified. In addition, the thickness of film layers on the packaging structure 200 is reduced, which is beneficial to the ultra-thin design of the terminal product.

Optionally, the microstructure layer 221 may be made from a transparent organic material with a refractive index higher than 1.5. For example, the microstructure layer 221 may be made from acrylic acid-acrylic resin.

Optionally, the planarization layer 222 may be made from a transparent organic material with a refractive index of 1 to 1.5. For example, the planarization layer 222 may be made from an optical adhesive.

Optionally, the inorganic packaging layer close to the substrate 100 may be made from silicon oxide, and the inorganic packaging layer on the side of the organic packaging layer 220 away from the substrate 100 may be made from silicon nitride, such that the packaging reliability can be guaranteed.

Figure 4:
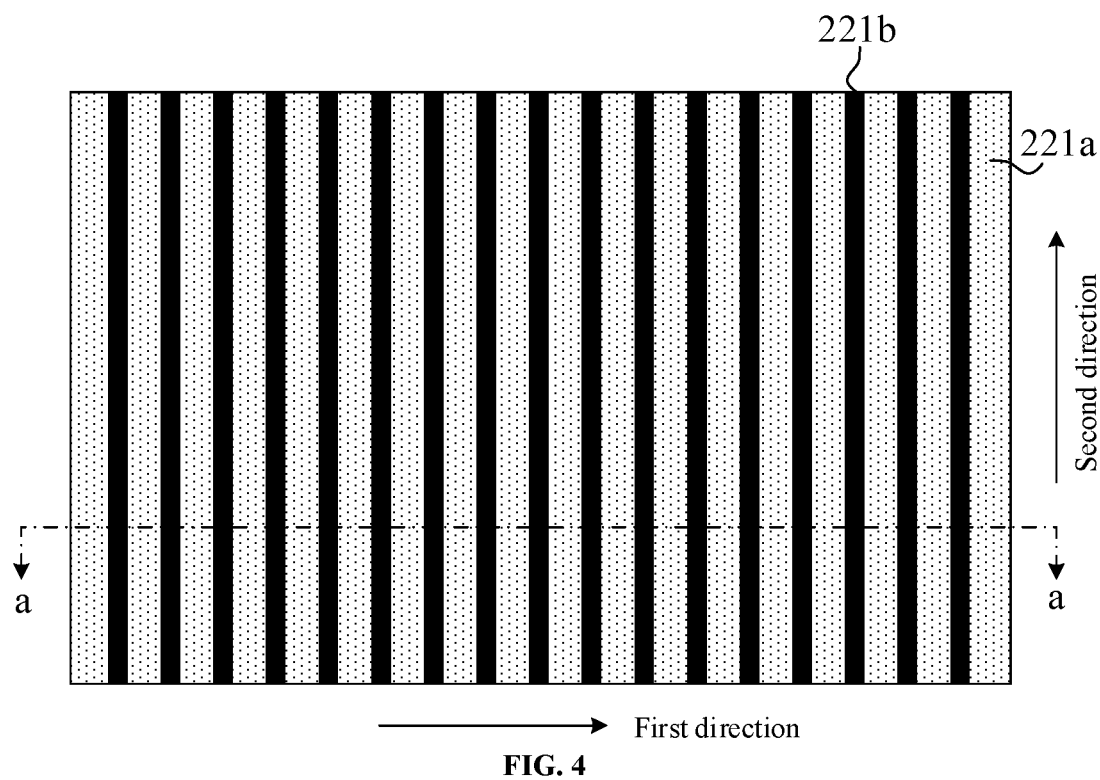
FIG. 4 is a top view of a packaging structure according to an embodiment of the present disclosure.

FIG. 4 is a top view of a packaging structure according an embodiment of the present disclosure, and both FIG. 1 and FIG. 2 may be sectional views of FIG. 4 in the aa direction. In addition, to clearly illustrate the base structure 221a and the protrusion structures 221b, different filling patterns are used to represent the base structure 221a and the protrusion structures 221b in FIG. 4.

In some embodiments, referring to FIG. 4 and continuing to refer to FIG. 2, each protrusion structure 221b in the microstructure layer 221 is of a strip-shaped structure. It is assumed that the length extension direction of each protrusion structure 221b is a second direction (not shown in FIG. 2, and the second direction may be a direction perpendicular to paper and parallel to the substrate 100 in FIG. 2). The plurality of protrusion structures 221b in this embodiment refers to two or more protrusion structures 221b, and a direction in which the plurality of protrusion structures 221b is spaced apart is set as the first direction, and the first direction is a horizontal direction parallel to the paper, in FIG. 2. The sections of all the protrusion structures 221b in the first direction are rectangular, which is equivalent to that projections of all the protrusion structures 221b on the surface of the base structure 221a are distributed at intervals in a strip-shaped fashion. Thus, the protrusion structures 221b can form a light trap structure with a certain depth-width ratio, and the gap of the light trap structure is filled with the planarization layer 222 with a lower refractive index.

It's to be understood that the distance between the adjacent protrusion structures 221b may be the same or different, and may be specifically set according to actual conditions.

In the present embodiment, the protrusion structures 221b with the rectangular sections are spaced apart to form a light trap structure, which can effectively prevent the light incident into the area between the protrusion structures 221b from being reflected to the outside of the packaging structure 200, thereby further reducing the reflectivity of the externally incident light.

Figure 3:
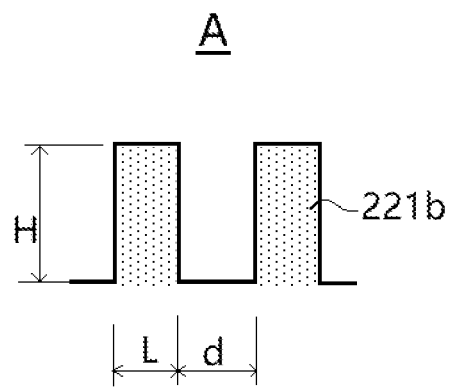
FIG. 3 is an enlarged diagram of A in FIG. 2 according to an embodiment of the present disclosure.

Optionally, as shown in FIG. 3, a ratio H/d of the height H of the protrusion structure 221b in a direction perpendicular to the base structure 221a and a distance d between the adjacent protrusion structures 221b ranges from 1 to 5. Besides, the ratio H/d may include the endpoint values 1 and 5.

In this embodiment, by reasonably setting the ratio of the height to the distance of the protrusion structures 221b, it is beneficial to block the light incident into the gap of the protrusion structures 221b in the packaging structure, such that the light may not be easily reflected to the outside of the packaging structure 200, to further reduce the reflectivity of the externally incident light. In addition, the process cost and the preparation difficulty may be reasonably controlled, and the quality of the packaging film layers may be guaranteed.

Optionally, the distance d between the adjacent protrusion structures 221b may be equal, i.e., the protrusion structures 221b are uniformly spaced apart. The distance d between the adjacent protrusion structures 221b may be set to 1 nm-200 nm, and may include the endpoint values of 1 nm and 200 nm.

Optionally, the height H of each protrusion structure 221b in the direction perpendicular to the base structure 221a (a vertical direction parallel to the paper in FIG. 3) may be equal, that is, the sides of the protrusion structures 221b away from the base structure 221a are flush. Therefore, it is beneficial to reduce the process difficulty and improve the preparation efficiency. The height H of each protrusion structure 221b along the direction perpendicular to the base structure 221a may be 1 nm to 500 nm, and the height H may include endpoint values of 1 nm and 500 nm.

Optionally, the width L of each protrusion structure 221b in the first direction may be equal. The width L of each protrusion structure 221b in the first direction is 1 nm to 200 nm, and the width L may include the endpoint values of 1 nm and 200 nm.

Optionally, since parameter values such as the width L, the height H and the distance d of the protrusion structures 221b are all nanoscale, the protrusion structures 221b of the microstructure layer 221 may be patterned directly by the nano-imprinting technology, such that steps may be effectively reduced, and the preparation efficiency may be improved, on the premise of meeting the requirements on the preparation process parameters.

Figure 5:
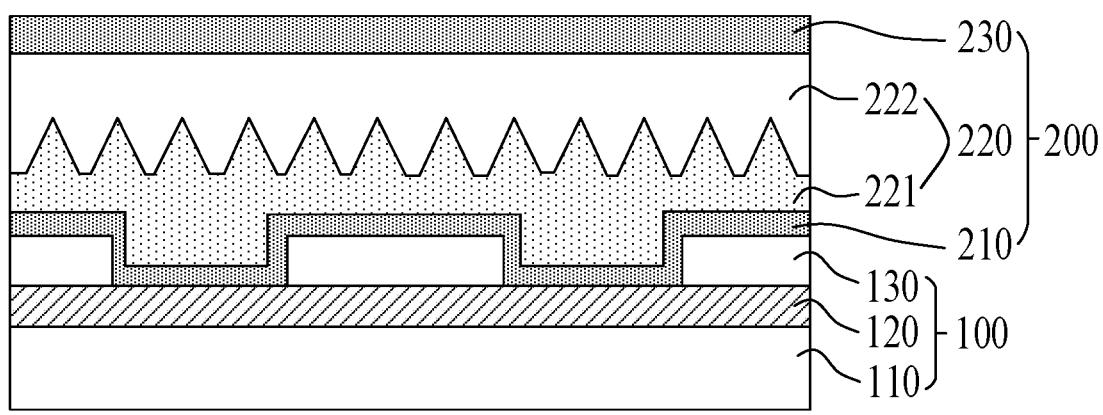
FIG. 5 is a schematic structural diagram of another packaging structure and a substrate that are laminated up according to an embodiment of the present disclosure.
Figure 6:
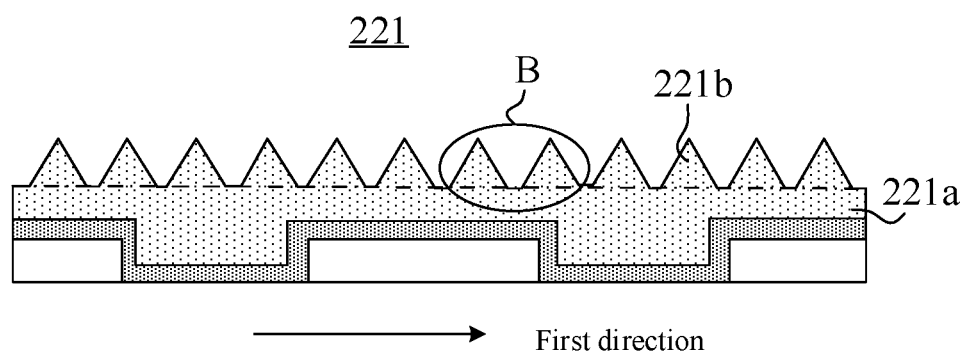
FIG. 6 is a schematic structural diagram of a microstructure layer of another packaging structure according to an embodiment of the present disclosure.

In some embodiments, with reference to FIG. 5 and FIG. 6, each protrusion structure 221b in the microstructure layer 221 is of a strip-shaped structure. It is assumed that the length extension direction of each protrusion structure 221b is a second direction (not shown in FIG. 6, and the second direction may be a direction perpendicular to paper and parallel to the substrate 100 in FIG. 6). The plurality of protrusion structures 221b in this embodiment refers to two or more protrusion structures 221b. It is assumed that a direction in which the plurality of protrusion structures 221b is spaced apart is the first direction, and the first direction is a horizontal direction parallel to the paper in FIG. 6. The sections of the protrusion structures 221b in the first direction may be triangular, which is equivalent to that the protrusion structures 221b are distributed in zigzag structures on the whole, and the zigzag structures may be continuously distributed or distributed at intervals on the surface of the base structure 221a.

In the present embodiment, the protrusion structure 221b is of a strip-shaped structure with a triangular section, which not only reduces the reflectivity of the externally incident light, but also increases the emergent area of light below the packaging structure 200, so that the internal light diverges and is emitted out, thereby increasing the visual angle of the terminal product.

Figure 7:
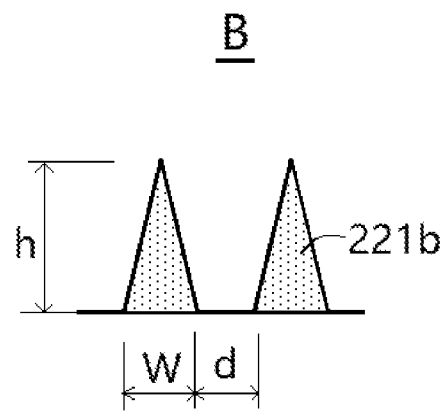
FIG. 7 is an enlarged diagram of B in FIG. 6 according to an embodiment of the present disclosure.

Optionally, as shown in FIG. 7, for the protrusion structure 221b with a triangular section in the first direction, in order to comprehensively consider the transmittance of the externally incident light and the divergence effect of internal light, it is necessary to reasonably control relevant dimensional parameters of the protrusion structure 221b with the triangular section.

Optionally, the length W of the base of the triangular section (i.e., the maximum width of the protrusion structure 221b in the first direction) may be 200 nm to 1000 nm, and may include the endpoint values of 200 nm and 1000 nm.

Optionally, the height h of the triangular section (i.e., the height of the protrusion structure 221b in a direction perpendicular to the base structure 221a) may be 200 nm to 800 nm and may include the endpoint values of 200 nm and 800 nm.

Optionally, for the protrusion structure 221b with a triangular section in the first direction, the distance d between the adjacent protrusion structures 221b may be 0 to 200 nm and the distance d may include the endpoints values of 0 and 200 nm. It can be understood that when the minimum distance d between the protrusion structures 221b is 0, the bases of the adjacent triangular sections are connected together, and there is no horizontal transition portion therebetween in the first direction.

Based on the same inventive concept, an embodiment of the present disclosure further provides a display panel. Continuing to refer to FIG. 1 and FIG. 5, the display panel includes: a substrate 100 and the aforementioned packaging structure 200 in the embodiments of the present disclosure. The substrate 100 in the display panel includes a base layer 110, as well as a switching device layer 120 and a light-emitting device layer 130 sequentially laminated on the base layer 110. The inorganic packaging layer of the packaging structure 200 is disposed on the side of the light-emitting device layer 130 away from the base layer 110. The switching device layer 120 may include a plurality of thin film transistors (TFT). The light-emitting device layer 130 may include a plurality of light-emitting elements, and the light-emitting element may be an OLED. That is, the display panel may be an OLED display panel.

The display panel provided by the present embodiment includes the aforementioned packaging structure 200. In the packaging structure, the organic packaging layer 220 includes the microstructure layer 221 and the planarization layer 222 with different refractive indexes, such that light incident into the organic packaging layer 220 from outside enters a medium of the microstructure layer 221 with a relatively high refractive index from a medium of the planarization layer 222 with a relatively low refractive index, thereby avoiding total reflection and reducing the reflectivity of the externally incident light.

The plurality of protrusion structures 221b in the microstructure layer 221 are spaced apart on the surface of the base structure 221a away from the inorganic packaging layer, so that light incident from the planarization layer 222 may be incident into the microstructure layer 221 from the area between the adjacent protrusion structures 221b, and the incident light may be blocked in the microstructure layer 221. Therefore, the transmittance of light may be further improved to increase the display brightness, without increasing the power consumption of the display panel. The microstructure layer 221 has an effect of reducing the reflectivity and thus may replace a Polaroid. Therefore, the preparation process is simplified, and the thickness of film layers on the packaging structure 200 is reduced, which is beneficial to an ultra-thin design of the terminal product.

Figure 8:
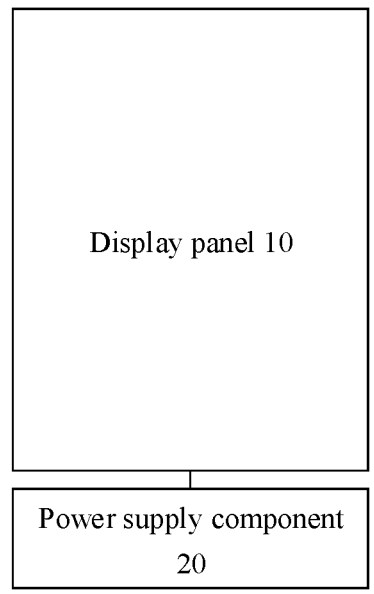
FIG. 8 is a schematic structural diagram of a display device according to an embodiment of the present disclosure.

Based on the same inventive concept, an embodiment of the present disclosure further provides a display device. As shown in FIG. 8, the display device includes the aforementioned display panel 10 in the embodiments and a power supply component 20. The power supply component 20 is configured to supply power for the display panel 10.

The display device provided by the present embodiment includes the display panel 10 in the foregoing embodiment. The packaging structure 200 in the display panel 10 includes the microstructure layer 221 and the planarization layer 222 with different refractive indexes, so that the light incident into the organic packaging layer 220 from outside enters a medium of the microstructure layer 221 with a relatively high refractive index from a medium of the planarization layer 222 with a relatively low refractive index, thereby avoiding total reflection and reducing the reflectivity of the externally incident light.

The plurality of protrusion structures 221b in the microstructure layer 221 are spaced apart on the surface of the base structure 221a away from the inorganic packaging layer, so that light incident from the planarization layer 222 may be incident into the microstructure layer 221 from the area between the adjacent protrusion structures 221b, and the incident light may be blocked in the microstructure layer 221. Therefore, the transmittance of light may be further improved to increase the display brightness, without increasing the power consumption of the display panel. The microstructure layer 221 has an effect of reducing the reflectivity and thus may replace a Polaroid. Therefore, the preparation process is simplified, and the thickness of film layers on the packaging structure 200 is reduced, which is beneficial to an ultra-thin design of the terminal product.

Figure 9:
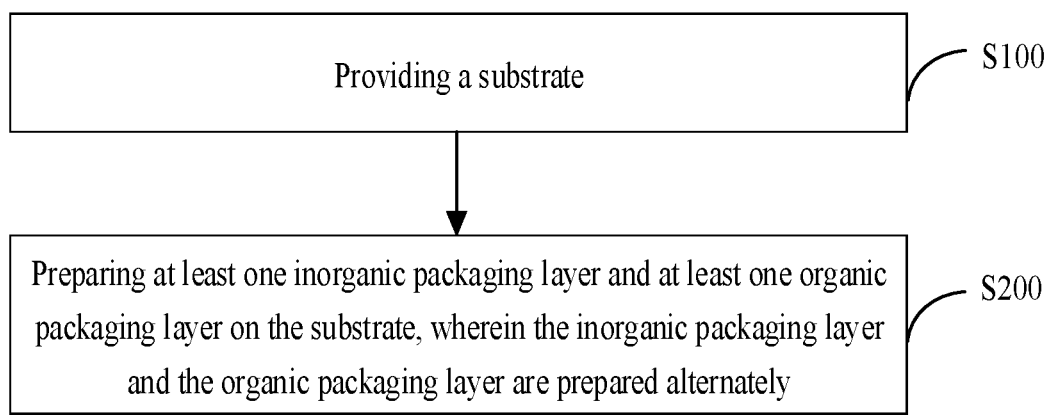
FIG. 9 is a flow chart of a method for preparing a packaging structure according to an embodiment of the present disclosure.

Based on the same inventive concept, as shown in FIG. 9, an embodiment of the present disclosure provides a method for preparing a packaging structure 200. The method includes the following steps.

In S100, a substrate 100 is provided.

Optionally, the substrate 100 serves as a support carrier of a packaging structure 200, and may have different structures for different terminal products. For example, as an OLED display panel, the substrate 100 may be a display function structure including a base layer 110, a switching device layer 120, and a light-emitting device layer 130.

In S200, at least one inorganic packaging layer and at least one organic packaging layer 220 are prepared on the substrate 100, wherein the inorganic packaging layer and the organic packaging layer 220 are prepared alternately.

Optionally, the packaging structure 200 generally includes a plurality of inorganic packaging layers and a plurality of organic packaging layers 220 which are alternately laminated, and the specific number of layers of the inorganic packaging layers and the organic packaging layers 220 may be set based on actual demands of the packaging structure 200. The present embodiment is illustrated by taking an example in which one inorganic packaging layer and one organic packaging layer 220 are prepared on the substrate 100.

In order to reduce the reflection effect of the packaging structure 200 on externally incident light, the organic packaging layer 220 may be designed into a structure including two film layers with different refractive indexes, namely a microstructure layer 221 and a planarization layer 222. The microstructure layer 221 is close to the substrate 100 relative to the planarization layer 222, and the planarization layer 222 is away from the substrate 100 relative to the microstructure layer 221. In addition, the refractive index of the planarization layer 222 is lower than that of the microstructure layer 221. Therefore, light incident into the organic packaging layer 220 from outside first enters a medium with a lower refractive index (an optically thinner medium) and then enters a medium with a higher refractive index (an optically denser medium). Thus, total reflection is avoided and the light can be incident into the packaging structure 200 as much as possible.

The microstructure layer 221 includes a base structure 221a disposed on the inorganic packaging layer and a plurality of protrusion structures 221b. The base structure 221a is parallel to the substrate 100, and the plurality of protrusion structures 221b extends from the surface of the base structure 221a to the side away from the inorganic packaging layer. The plurality of protrusion structures 221b is spaced apart on the surface of the base structure 221a away from the inorganic packaging layer, so that light incident from the planarization layer 222 may be incident into the microstructure layer 221 from the area between the adjacent protrusion structures 221b to play a role similar to that of an optical grating. Thus, the transmittance of light may be further improved.

To facilitate preparation of other film layers ((another inorganic packaging layer in this embodiment) on the organic packaging layer 220, the protrusion structures 221b of the microstructure layer 221 are planarized by the planarization layer 222. That is, at least gaps between the adjacent protrusion structures 221b are filled and leveled up with the planarization layer 222, and the side of the planarization layer 222 away from the inorganic packaging layer is of a planar structure. The side of the planarization layer 222 away from the inorganic packaging layer may be flush with the sides of the protrusion structures 221b away from the inorganic packaging layer, or may completely cover the entire protrusion structures 221b.

By the method for preparing the packaging structure 200 according to the present embodiment, the organic packaging layer 220 and the inorganic packaging layer are prepared on the substrate 100, and the organic packaging layer 220 is provided with the microstructure layer 221 and the planarization layer 222 with different refractive indexes. Therefore, light incident into the organic packaging layer 220 from outside enters a medium of the microstructure layer 221 with a relatively high refractive index from a medium of the planarization layer 222 with a relatively low refractive index, so that total reflection may be avoided and the reflectivity of the externally incident light may be reduced.

The plurality of protrusion structures 221b in the microstructure layer 221 are spaced apart on the surface of the base structure 221a away from the inorganic packaging layer, so that light incident from the planarization layer 222 may be incident into the microstructure layer 221 from the area between the adjacent protrusion structures 221b, and the incident light may be blocked in the microstructure layer 221. Therefore, the transmittance of light may be further improved to increase the display brightness. The microstructure layer 221 has an effect of reducing the reflectivity and thus may replace a Polaroid. Therefore, the preparation process is simplified, and the thickness of film layers on the packaging structure 200 is reduced, which is beneficial to an ultra-thin design of the terminal product.

Figure 10:
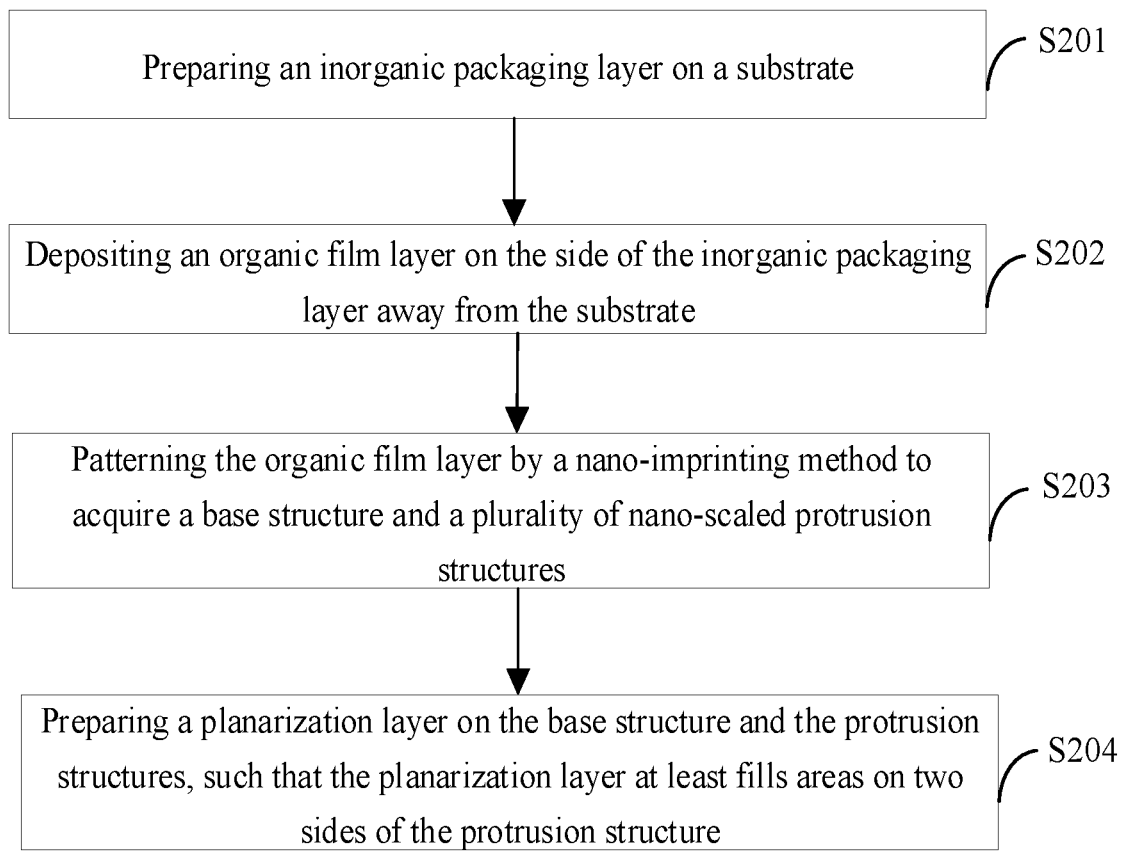
FIG. 10 is a flow chart of a specific process of S200 in FIG. 9 according to an embodiment of the present disclosure.

Based on the contents of the foregoing embodiment of the present disclosure, as shown in FIG. 10, after a substrate is provided, step S200 includes the following steps.

In S201, an inorganic packaging layer is prepared on the substrate 100.

Optionally, the inorganic packaging layer may be prepared by a deposition process, such as plasma enhanced chemical vapor deposition (PECVD) or atomic layer deposition (ALD). The inorganic packaging layer may be made from silicon oxide.

In S202, an organic film layer is deposited on the side of the inorganic packaging layer away from the substrate 100.

Optionally, an organic film layer is deposited on the inorganic packaging layer. The organic film layer is made from a transparent material and thus does not affect the display effect. The organic film layer may be prepared by an ink-jet printing process.

In S203, the organic film layer is patterned by a nano-imprinting method to acquire a base structure 221a and a plurality of nano-scaled protrusion structures 221b.

Optionally, in order to set relevant size parameters of the protrusion structures 221b in the microstructure layer 221 to nanoscale, in the present embodiment, a pre-prepared nano-imprinting template is used to imprint the organic film layer by the nano-imprinting process, to acquire the plurality of nano-scaled protrusion structures 221b. The portion of the organic film layer which is not imprinted by the imprinting template is the base structure 221a.

In S204, a planarization layer 222 is prepared on the base structure 221a and the protrusion structures 221b, so that the planarization layer 222 at least fills areas on two side of the protrusion structure 221b.

Optionally, in order to facilitate preparation of other film layers on the packaging structure 200, the protrusion structures 221b of the microstructure layer 221 are planarized by the planarization layer 222. That is, at least gaps between the adjacent protrusion structures 221b are filled and leveled up with the planarization layer 222, and the side of the planarization layer 222 away from the inorganic packaging layer is of a planar structure. The side of the planarization layer 222 away from the inorganic packaging layer may be flush with the sides of the protrusion structures 221b away from the inorganic packaging layer, or completely cover the entire protrusion structures 221b.

The embodiments of the present disclosure at least have the following technical effects.

1. By designing the organic packaging layer into the microstructure layer and the planarization layer with different refractive indexes, light incident into the organic packaging layer from outside enters a medium of the microstructure layer with a relatively high refractive index from a medium of the planarization layer with a relatively low refractive index, thereby avoiding total reflection and reducing the reflectivity of the externally incident light. The plurality of protrusion structures in the microstructure layer are spaced apart on the surface of the base structure away from the inorganic packaging layer, so that light incident from the planarization layer may be incident into the microstructure layer from the area between the adjacent protrusion structures, and the incident light may be blocked in the microstructure layer. Therefore, the transmittance of light may be further improved to improve the display brightness without increasing the power consumption of the display panel. The microstructure layer has an effect of reducing the reflectivity and thus may replace a polaroid, such that the preparation process is simplified, and the thickness of film layers on the packaging structure is reduced, which is beneficial to an ultra-thin design of the terminal product.

2. The protrusion structure with a rectangular section can effectively prevent light incident into the area between the protrusion structures from being reflected to the outside of the packaging structure, thereby further reducing the reflectivity of the externally incident light.

3. By reasonably setting the ratio of the height of the protrusion structure to the distance between adjacent protrusion structures, on the one hand, it is beneficial to block the light incident into the gap between the protrusion structures in the packaging structure, such that light is not easily reflected to the outside of the packaging structure, thereby further reducing the reflectivity of the externally incident light; and on the other hand, the process cost and the manufacturing difficulty may be reasonably controlled, and the quality of the packaging film layers can be guaranteed.

4. The protrusion structure with a triangular section not only reduces the reflectivity of the externally incident light, but also increases the emergent area of light below the packaging structure, so that the internal light diverges and is emitted out, thereby increasing the visual angle of the terminal product.

In the descriptions of the present disclosure, it is to be understood that orientation or positional relationship indicated by the terms "center", "on", "below", "front", "back", "left", "right", "vertical", "horizontal", "top", "bottom", "inside", "outside", and the like are shown based on the drawings, and are only intended for describing the present disclosure and simplifying descriptions, instead of indicating or implying that the specified device or element has to be specifically disposed or structured and operated in a specific direction, and therefore, should not be construed as limiting the present disclosure.

The terms "first" and "second" are only for the purpose of description and should not be construed as indicating or implying relative importance or implicitly indicating the number of technical features indicated. Thus, the features defined by the terms "first" and "second" may include one or more of the features either explicitly or implicitly. In the description of the present disclosure, the term "plurality" means two or more, unless otherwise specified.

In the description of the present disclosure, unless otherwise specified and limited, the terms "mount", "connected with" and "connected to" should be understood in broad sense. For example, connection may be fixed connection, detachable connection or integrated connection; and may be direct connection, or indirect connection via an intermediation, and may be internal communication between two elements. Those of ordinary skill in the art shall understand the specific meaning of the above terms in accordance with specific conditions.

In the description of the present disclosure, the particular features, structures, materials or characteristics can be combined in a proper manner in any one or more embodiments or examples.

The above descriptions are merely some embodiments of the present disclosure. It should be noted that those of ordinary skill in the art can make improvements and modifications without departing from the principle of the present disclosure, and these improvements and modifications shall fall within the protection scope of the present disclosure.

What is claimed is:

1. A packaging structure, comprising an inorganic packaging layer and an organic packaging layer laminated on a substrate, wherein the organic packaging layer comprises a microstructure layer and a planarization layer that are sequentially laminated in a direction away from the substrate, a refractive index of the planarization layer being lower than a refractive index of the microstructure layer;

wherein the microstructure layer comprises a base structure on the inorganic packaging layer and a plurality of protrusion structures extending from a surface of the base structure away from the inorganic packaging layer, the plurality of protrusion structures being spaced apart on the surface of the base structure away from the inorganic packaging layer; and the planarization layer at least fills gaps between adjacent protrusion structures, and a side of the planarization layer away from the inorganic packaging layer is of a planar structure.

2. The packaging structure according to claim 1, wherein a section of the protrusion structure in a first direction is rectangular, the first direction being a direction in which the plurality of protrusion structures is spaced apart.

3. The packaging structure according to claim 2, wherein a ratio of a height of the protrusion structure in a direction perpendicular to the base structure to a distance between the adjacent protrusion structures ranges from 1 to 5.

4. The packaging structure according to claim 3, wherein the protrusion structure has at least one of the following technical features:

distances between the adjacent protrusion structures are equal;

the protrusion structures have an equal height in the direction perpendicular to the base structure; or the protrusion structures have an equal width in the first direction.

5. The packaging structure according to claim 4, wherein the height of the protrusion structure in the direction perpendicular to the base structure is 1 nm to 500 nm.

6. The packaging structure according to claim 4, wherein the width of the protrusion structure in the first direction is 1 nm to 200 nm.

7. The packaging structure according to claim 4, wherein the distance between the adjacent protrusion structures is 1 nm to 200 nm.

8. The packaging structure according to claim 7, wherein the height of the protrusion structure in the direction perpendicular to the base structure is 1 nm to 500 nm, and the width of the protrusion structure in the first direction is 1 nm to 200 nm; and the microstructure layer is made from acrylic acid-acrylic resin, and the planarization layer is made from an optical adhesive.

9. The packaging structure according to claim 1, wherein a section of the protrusion structure in a first direction is triangular, the first direction being a direction in which the plurality of protrusion structures is spaced apart.

10. The packaging structure according to claim 9, wherein a maximum width of the protrusion structure in the first direction is 200 nm to 1000 nm.

11. The packaging structure according to claim 10, wherein a minimum distance between the adjacent protrusion structures is 0 nm to 200 nm, and a height of the protrusion structure in a direction perpendicular to the base structure is 200 nm to 800 nm; and
the microstructure layer is made from acrylic acid-acrylic resin, and the planarization layer is made from an optical adhesive.

12. The packaging structure according to claim 9, wherein a minimum distance between the adjacent protrusion structures is 0 nm to 200 nm.

13. The packaging structure according to claim 9, wherein a height of the protrusion structure in a direction perpendicular to the base structure is 200 nm to 800 nm.

14. The packaging structure according to claim 1, wherein the microstructure layer is made from a transparent organic material with a refractive index higher than 1.5.

15. The packaging structure according to claim 14, wherein the microstructure layer is made from acrylic acid-acrylic resin.

16. The packaging structure according to claim 14, wherein the planarization layer is made from an optical adhesive.

17. The packaging structure according to claim 1, wherein the planarization layer is made from a transparent organic material with a refractive index of 1 to 1.5.

18. A display panel, comprising a substrate and a packaging structure;
wherein the packaging structure comprises an inorganic packaging layer and an organic packaging layer laminated on the substrate, the organic packaging layer comprising a microstructure layer and a planarization layer that are sequentially laminated in a direction away from the substrate, a refractive index of the planarization layer being lower smaller than a refractive index of the microstructure layer; wherein
the microstructure layer comprises a base structure on the inorganic packaging layer and a plurality of protrusion structures extending from a surface of the base structure away from the inorganic packaging layer, the plurality of protrusion structures being spaced apart on the surface of the base structure away from the inorganic packaging layer; and
the planarization layer at least fills gaps between adjacent protrusion structures, and a side of the planarization layer away from the inorganic packaging layer is of a planar structure.

19. The display panel according to claim 18, wherein the substrate comprises a base layer, as well as a switching device layer and a light-emitting device layer sequentially laminated on the base layer, and the inorganic packaging layer of the packaging structure is on a side of the light-emitting device layer away from the base layer.

20. A display device, comprising a power supply component and a display panel, wherein the power supply component is configured to supply power for the display panel, and the display panel comprises a substrate and a packaging structure;
wherein the packaging structure comprises an inorganic packaging layer and an organic packaging layer laminated on the substrate, the organic packaging layer comprising a microstructure layer and a planarization layer that are sequentially laminated in a direction away from the substrate, a refractive index of the planarization layer being lower than a refractive index of the microstructure layer;
wherein the microstructure layer comprises a base structure on the inorganic packaging layer and a plurality of protrusion structures extending from a surface of the base structure away from the inorganic packaging layer, the plurality of protrusion structures being spaced apart on the surface of the base structure away from the inorganic packaging layer; and
the planarization layer at least fills gaps between adjacent protrusion structures, and a side of the planarization layer away from the inorganic packaging layer is of a planar structure.

* * * * *